(12) United States Patent
Paraschou et al.

(10) Patent No.: US 7,560,959 B2
(45) Date of Patent: Jul. 14, 2009

(54) ABSOLUTE VALUE PEAK DIFFERENTIAL VOLTAGE DETECTOR CIRCUIT AND METHOD

(75) Inventors: Milam Paraschou, Eden Prairie, MN (US); Robert L. Rabe, Chanhassen, MN (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 11/523,795

(22) Filed: Sep. 18, 2006

(65) Prior Publication Data

US 2008/0084956 A1     Apr. 10, 2008

(51) Int. Cl.
*H03K 5/22* (2006.01)
(52) U.S. Cl. ............................. 327/72; 327/73; 327/59; 327/65
(58) Field of Classification Search ............. 327/58–60, 327/63–65, 72, 73
See application file for complete search history.

(56) References Cited

U.S. PATENT DOCUMENTS

| | | | |
|---|---|---|---|
| 3,940,681 A | 2/1976 | Ohsawa | 321/47 |
| 3,943,468 A | 3/1976 | Cox et al. | 333/18 |
| 4,082,924 A | 4/1978 | Carlqvist et al. | 179/84 |
| 4,112,317 A | 9/1978 | Everswick | 307/308 |
| 4,157,509 A | 6/1979 | Zielinski | 328/147 |
| 4,163,909 A | 8/1979 | Harr | 307/351 |
| 4,219,839 A | 8/1980 | Watanabe | 358/27 |
| 4,346,411 A | 8/1982 | Buhler et al. | 360/46 |
| 4,529,892 A | 7/1985 | Reilly et al. | 307/361 |
| 4,549,099 A | 10/1985 | Yamada et al. | 307/359 |
| 4,633,186 A | 12/1986 | Wiegel et al. | 328/119 |
| 4,642,489 A | 2/1987 | Wilcox | 307/514 |
| 4,789,838 A | 12/1988 | Cheng | 328/150 |
| 4,796,030 A | 1/1989 | Colotti et al. | 342/40 |
| 4,851,719 A | 7/1989 | Hitomi | 307/521 |
| 4,926,068 A | 5/1990 | Fujita | 307/359 |
| 4,926,442 A | 5/1990 | Bukowski et al. | 375/76 |
| 4,989,074 A | 1/1991 | Matsumoto | 358/21 R |
| 5,126,683 A | 6/1992 | Ishikawa et al. | 329/369 |
| 5,164,864 A | 11/1992 | Perroud et al. | 360/64 |
| 5,410,556 A | 4/1995 | Yeh et al. | 371/43 |
| 5,418,409 A | 5/1995 | Kuhn | 327/78 |
| 5,530,395 A | 6/1996 | Ting | 327/543 |
| 5,546,027 A * | 8/1996 | Shinozaki et al. | 327/59 |
| 5,561,390 A | 10/1996 | Hiiragizawa | 327/147 |
| 5,610,827 A | 3/1997 | Reilly | 364/487 |
| 5,939,874 A | 8/1999 | Duley | 324/96 |
| 5,969,646 A | 10/1999 | Cheng et al. | 341/53 |

(Continued)

*Primary Examiner*—An T. Luu
(74) *Attorney, Agent, or Firm*—Dorsey & Whitney LLP (57) ABSTRACT

A peak voltage detector is used to detect the absolute value of the peak differential amplitude of a differential input signal. The peak voltage detector includes a differential amplifier receiving the differential input signal and generating a corresponding pair of differential output signals. The voltage detector also includes a capacitor on which an output signal is generated. A first differential comparator generates a first signal whenever the differential voltage from the differential amplifier is greater than the voltage of the output signal. A second differential comparator generates a second signal whenever the negative of the differential voltage from the differential amplifier is greater than the voltage of the output signal. A current source applies current to the capacitor responsive to receiving either the first or second signal. The amplitude of the feedback voltage is thus equal to the absolute value of the peak differential amplitude of the input signal.

41 Claims, 3 Drawing Sheets

U.S. PATENT DOCUMENTS

| | | | |
|---|---|---|---|
| 5,999,021 A | 12/1999 | Jang | 327/97 |
| 6,040,732 A * | 3/2000 | Brokaw | 327/408 |
| 6,064,238 A | 5/2000 | Wight et al. | 327/58 |
| 6,064,870 A | 5/2000 | Kasperkovitz et al. | 455/296 |
| 6,134,279 A | 10/2000 | Soichi et al. | 375/341 |
| 6,211,716 B1 * | 4/2001 | Nguyen et al. | 327/307 |
| 6,268,764 B1 | 7/2001 | Eagar et al. | 327/539 |
| 6,278,338 B1 | 8/2001 | Jansson | 331/116 FE |
| 6,339,349 B1 | 1/2002 | Rajagopalan | 327/131 |
| 6,348,816 B1 | 2/2002 | Havens et al. | 327/58 |
| 6,356,106 B1 | 3/2002 | Greeff et al. | 326/30 |
| 6,359,426 B1 | 3/2002 | Sarles et al. | 323/281 |
| 6,384,670 B1 | 5/2002 | Eagar et al. | 327/539 |
| 6,424,212 B1 | 7/2002 | Brandt | 330/140 |
| 6,448,821 B1 | 9/2002 | Sakurai | 327/56 |
| 6,510,339 B2 | 1/2003 | Kovtun et al. | 600/509 |
| 6,587,012 B1 | 7/2003 | Farmer et al. | 333/15 |
| 6,617,889 B1 | 9/2003 | Richardson | 327/77 |
| 6,664,816 B1 | 12/2003 | Nguyen et al. | 327/74 |
| 6,741,118 B2 * | 5/2004 | Uchikoba et al. | 327/541 |
| 6,823,025 B2 | 11/2004 | Lee et al. | 375/320 |
| 6,888,381 B2 | 5/2005 | Momtaz et al. | 327/58 |
| 7,010,283 B2 | 3/2006 | Matsumoto et al. | 455/226.1 |
| 7,012,472 B2 | 3/2006 | Xu et al. | 331/16 |
| 7,049,856 B2 | 5/2006 | Momtaz et al. | 327/58 |
| 7,123,176 B1 | 10/2006 | Jordanov | 341/132 |
| 7,196,947 B2 * | 3/2007 | Seitz | 365/189.11 |
| 7,348,808 B2 * | 3/2008 | Moussavi | 327/77 |
| 2003/0001667 A1 | 1/2003 | Casper et al. | 330/9 |
| 2003/0160696 A1 | 8/2003 | Vig et al. | 340/551 |
| 2003/0169551 A1 | 9/2003 | Sugimoto et al. | 361/92 |
| 2003/0184348 A1 | 10/2003 | Lee | 327/100 |
| 2003/0197531 A1 | 10/2003 | Hastings | 327/77 |
| 2004/0051565 A1 | 3/2004 | Dreps et al. | 327/65 |
| 2004/0212401 A1 | 10/2004 | Chien | 327/58 |
| 2005/0007161 A1 | 1/2005 | Saint-Luc et al. | 327/108 |
| 2005/0046451 A1 | 3/2005 | Streif et al. | 327/143 |
| 2005/0104631 A1 | 5/2005 | Horie et al. | 327/78 |
| 2005/0146456 A1 | 7/2005 | Kondo | 341/162 |
| 2005/0174150 A1 | 8/2005 | Yamasaki et al. | 327/77 |
| 2005/0189950 A1 | 9/2005 | Lu | 324/606 |
| 2005/0218958 A1 | 10/2005 | Ajram et al. | 327/333 |
| 2005/0219109 A1 | 10/2005 | Kobayashi et al. | 341/165 |
| 2005/0231268 A1 | 10/2005 | Kim | 327/538 |
| 2006/0149859 A1 | 7/2006 | Dubal et al. | 710/8 |
| 2006/0171247 A1 | 8/2006 | Hoppe et al. | 365/233 |

* cited by examiner

ABSOLUTE VALUE PEAK DIFFERENTIAL VOLTAGE DETECTOR CIRCUIT AND METHOD

TECHNICAL FIELD

This invention relates to digital and analog circuits, and, more particularly, to a circuit and method for detecting the peak absolute value of a signal.

BACKGROUND OF THE INVENTION

Figure 1:
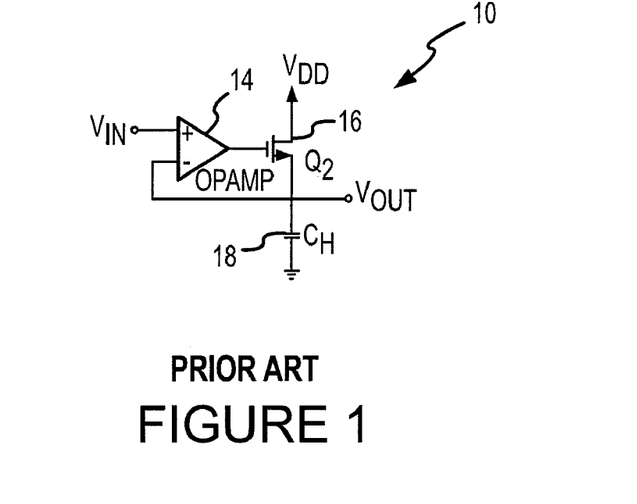
FIG. 1 is a schematic diagram of a conventional peak detector circuit.

It is important in a large variety of electrical devices to be able to detect the peak value of a digital or analog signal, or to determine if the amplitude of a digital or analog signal has exceeded a predetermined value. For example, it may be necessary to determine if a signal is present or to recognize if a signal that is present has a amplitude exceeding a threshold, such as a value corresponding to a specific logic level. A peak detector 10 conventionally used for this purpose is shown in FIG. 1. The peak detector 10 receives an input signal $V_{IN}$ at a non-inverting input of an operational amplifier 14. The output of the operational amplifier 14 is connected to the gate of an NMOS transistor 16, which has its drain connected to a voltage $V_{DD}$ and its source connected to a capacitor 18 and to the inverting input of the operational amplifier 14. As is well known in the art, a signal provided to the inverting input of the operational amplifier 14 provides negative feedback.

The operation of the peak detector 10 will now be explained. It is assumed that the capacitor 18 is initially discharged. When the voltage $V_{IN}$ increases, the output of the operational amplifier 14 will also increase. The voltage at the output of the operational amplifier 14 can be expected to quickly increase to the full output of the amplifier 14 because of the high gain that is typically achieved in operational amplifiers. As a result, the transistor 16 will be turned ON, thereby coupling the supply voltage $V_{CC}$ to the capacitor 18. The capacitor 18 will then be charged until the voltage $V_{OUT}$ is equal to $V_{IN}$. When $V_{OUT}$ is equal to $V_{IN}$, the output of the operational amplifier 14 will transition low, thereby turning OFF the transistor 16 and holding the voltage $V_{OUT}$ at the voltage $V_{IN}$. If the voltage $V_{IN}$ subsequently increases, the output of the amplifier 14 will again transition high to turn ON the transistor 16 until $V_{OUT}$ is again equal to $V_{IN}$. In this manner, the amplitude of $V_{OUT}$ will always be equal to the peak value of signal $V_{IN}$.

The peak detector 10 shown in FIG. 1 provides good performance in many applications. However, it may not be used in some situations. For example, the peak detector 10 cannot be used to determine the peak value of a differential signal, i.e., the maximum differential voltage between two signal lines. This limitation is particularly true if both of the signal lines are allowed to "float" so that the voltage on either of the signal lines can have any value.

Another limitation on the use of the peak detector 10 is that it can only be used to determine the peak value of a signal having a positive voltage. Although the peak detector 10 could be redesigned to detect the peak negative value of an input signal, it is important in some cases to determine whether the peak positive or peak negative value of the signal exceeds some threshold. For example, the signal applied to the peak detector may be an AC signal, which may have either a peak positive voltage or a peak negative voltage. The difficulty in detecting an input signal having either a peak positive voltage or a peak negative voltage is exacerbated when the input signal is a differential signal.

There is therefore a need for a peak detector that can detect the peak absolute differential amplitude of a differential input signal or determine if the peak absolute differential amplitude of the input signal exceeds a predetermined threshold.

SUMMARY OF THE INVENTION

A peak voltage detector and method generates an output signal corresponding to the peak amplitude of an input signal. The peak voltage detector and method includes a first comparator that compares the amplitude of the input signal to the amplitude of the output signal, and a second comparator that compares the negative of the amplitude of the input signal to the amplitude of the output signal. The amplitude of the output signal is increased responsive to detecting either that the amplitude of the input signal exceeds the amplitude of the output signal or the amplitude of the negative of the input signal exceeds the amplitude of the output signal. The amplitude of the output signal may be increased by using a current source to apply a current to a capacitor whenever either the amplitude of the input signal or the amplitude of the negative of the input signal exceeds the amplitude of the output signal. The input signal may be a differential input signal. In such case, the first comparator compares the differential amplitude of the input signal to the amplitude of the output signal, and a second comparator that compares the negative of the differential amplitude of the input signal to the amplitude of the output signal. The output signal may be applied to a comparator that also receives a reference voltage to detect whenever the peak amplitude of the input signal exceeds a predetermined value.

DETAILED DESCRIPTION OF THE INVENTION

Figure 2:
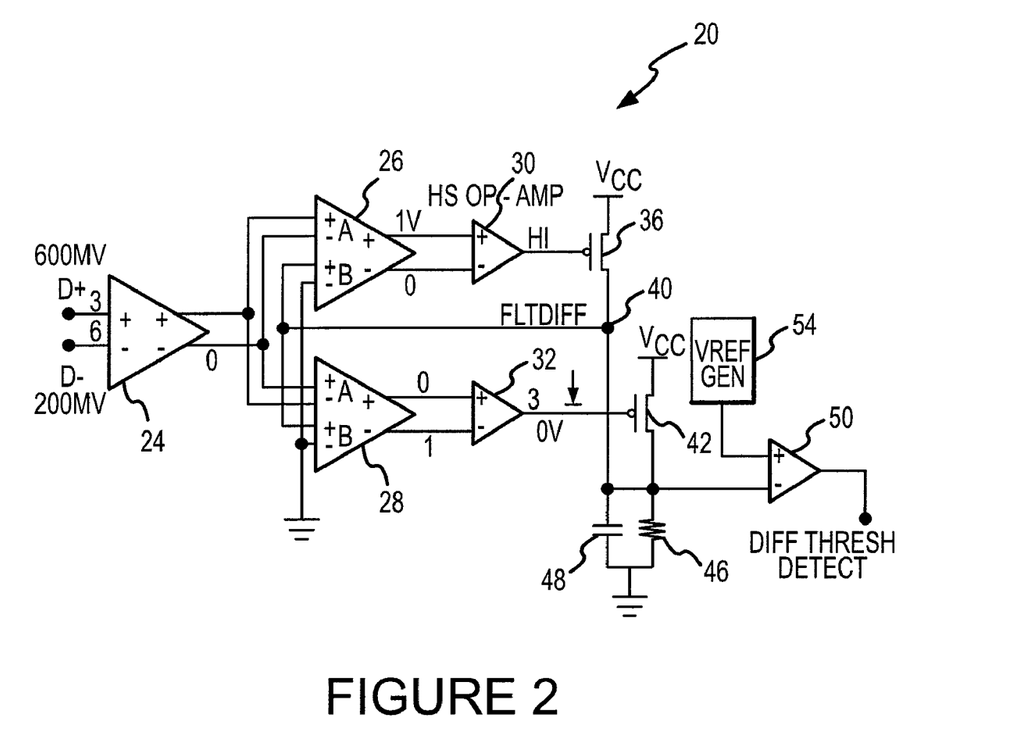
FIG. 2 is a schematic diagram of an absolute value differential signal peak detector according to one example of the invention.

A peak detector 20 according to one example of the invention is shown in FIG. 2. The peak detector 20 includes a differential amplifier 24 that receives a differential input signal D+, D−. The amplifier 24 generates a differential output signal that is applied to two differential amplifiers 26, 28, which provide additional gain to further amplify the differential input signal. Each of the amplifiers 26, 28 includes first differential inputs "A+" and "A−" and second differential input "B+" and "B−". The amplifiers 26, 28 each generate differential outputs having an amplitude that is proportional to $(A^+ - A^-) - (B^+ - B^-)$. The outputs of the amplifier 24 are applied to the "A" inputs of the amplifier 26 with the same polarity they are generated, and they are applied to the "A" inputs of the amplifier 28 with reverse polarity. Therefore, an increase in the amplitude of the differential signal at the output of the amplifier 24 causes a positive increase in the differential output from the amplifier 26 and a negative increase in the differential output from the amplifier 28.

The differential outputs of the amplifier 26 are applied to inputs of a comparator 30, which generates an output signal corresponding to the comparison. If the amplitude of the signal applied to the "+" input of the comparator 30 is greater than the amplitude of the signal applied to the "−" input of the comparator 30, the comparator outputs a high logic level. Otherwise, the output of the comparator 30 is at ground potential. Similarly, the differential outputs of the amplifier 28 are applied to the inputs of a comparator 32, which responds to those inputs in the same manner as the comparator 30.

The output of the comparator 30 is applied to the gate of a PMOS transistor 36, which has its source connected to receive a supply voltage $V_{CC}$ and its gate connected to a feedback node 40 on which a feedback signal FLTDIFF is generated. Similarly, the output of the comparator 32 is applied to the gate of a PMOS transistor 42, which also has its source connected to receive a supply voltage $V_{CC}$ and its drain connected to the feedback node 40. The FLTDIFF signal is applied to the "B+" inputs of the differential amplifiers 26, 28. The "B−" inputs of the amplifiers 26, 28 are connected to ground.

As explained in greater detail below, the feedback terminal 40 is driven by either of the PMOS transistors 36, 42 in a manner that causes the amplitude of the FLTDIFF signal to be equal to the absolute value of the amplitude of the differential input signal applied to the differential amplifier 24. This FLTDIFF signal is applied to a resistor 46 connected in parallel with a capacitor 48 and to a "−" input of a comparator 50. A "+" input of the comparator 50 receives a reference voltage VREF from a reference voltage generator 54, which sets a threshold level for the amplitude of the FLTDIFF signal at node 40. When the voltage at node 40 is less than the reference voltage VREF, the output of the comparator 50 is high. Conversely, when the voltage at the feedback node 40 is greater than the reference voltage VREF, the output of the comparator 50 is low.

The operation of the peak detector 20 will now be explained with the assumption that the amplitude of the FLTDIFF signal is initially zero volts. In response to a positive differential signal D+, D−, the differential amplifier 24 generates a positive differential signal at its output. If, for example, the differential amplifier 24 has unity gain, the differential output signal will be equal to the differential input signal, although the amplifier 24 need not have unity gain.

The positive output from the amplifier 24 causes the differential amplifier 26 to also generate a positive output. This positive output causes the comparator 30 to output a high logic level, which turns OFF the transistor 36. The positive differential output from the amplifier 24 also causes the differential amplifier 28 to generate a negative differential output, which causes the comparator 32 to generate a 0-volt output that turns ON the transistor 42. Current then flows through the transistor 42 to charge the capacitor 48 and increase the amplitude of the FLTDIFF signal. As a result, the voltage at the "B+" input of the differential amplifier 28 also increases.

When the voltage at the "B+" input of the amplifier 28 rises to the differential voltage applied to the "A−" input of the amplifier 28, the amplifier 28 outputs a positive differential signal that causes the comparator 32 to apply the supply voltage $V_{CC}$ to the gate of the transistor 42 thereby turning OFF the transistor 42. Assuming the amplifier 24 has unity gain, the amplitude of the FLTDIFF signal at the node 40 will then be equal to the amplitude of the differential input voltage (D+ less D−), and it will remain at that voltage if the amplitude of the differential input voltage subsequently decreases. If the capacitor 48 subsequently discharges through the resistor 46, the amplitude of the FLTDIFF signal will correspondingly decrease thereby causing the differential amplifier 28 to again output a differential signal that turns ON the transistor 42 to re-charge the capacitor 48. The circuit thus acts as a charge pump to maintain the amplitude of the FLTDIFF signal equal to the absolute value of the amplitude of the differential signal applied to the inputs of amplifier 24.

The peak detector 20 operates in a similar manner for a negative differential input voltage. In response to the negative differential input voltage, the amplifier 24 causes the differential amplifier 28 to generate a positive differential output, which causes the comparator 32 to output a high logic level. This high logic level turns OFF the transistor 42. The negative differential output from the amplifier 24 also causes the differential amplifier 26 to generate a negative differential output, which causes the comparator 30 to generate a 0-volt output that turns ON the transistor 36. Current then flows through the transistor 36 to charge the capacitor 48.

When the amplitude of the FLTDIFF signal rises to the level of the differential input signal, the amplifier 26 outputs a positive differential signal that causes the comparator 30 to apply the supply voltage $V_{CC}$ to the gate of the transistor 36 thereby turning OFF the transistor 36. Assuming again the amplifier 24 has unity gain, the amplitude of the FLTDIFF signal will then be equal to the differential amplitude of the input voltage (D+ less D−).

The amplitude of the FLTDIFF signal at the feedback node 40 will therefore be equal to the peak amplitude of the differential input signal regardless of whether the differential input signal is positive or negative. The FLTDIFF signal can be used as an indication of the peak absolute value of the differential input signal. Alternatively, by applying the FLTDIFF signal to the input of the comparator 50, the output of the comparator 50 can be used to indicate that the peak absolute value of the differential input signal has exceeded the reference voltage VREF output by the reference voltage generator.

Although the peak detector 20 shown in FIG. 2 receives a differential input signal, it will be understood that the peak detector 20 can easily be adapted to receive a single-ended input signal by simply grounding one of the differential inputs to the differential amplifier 24.

Figure 3:
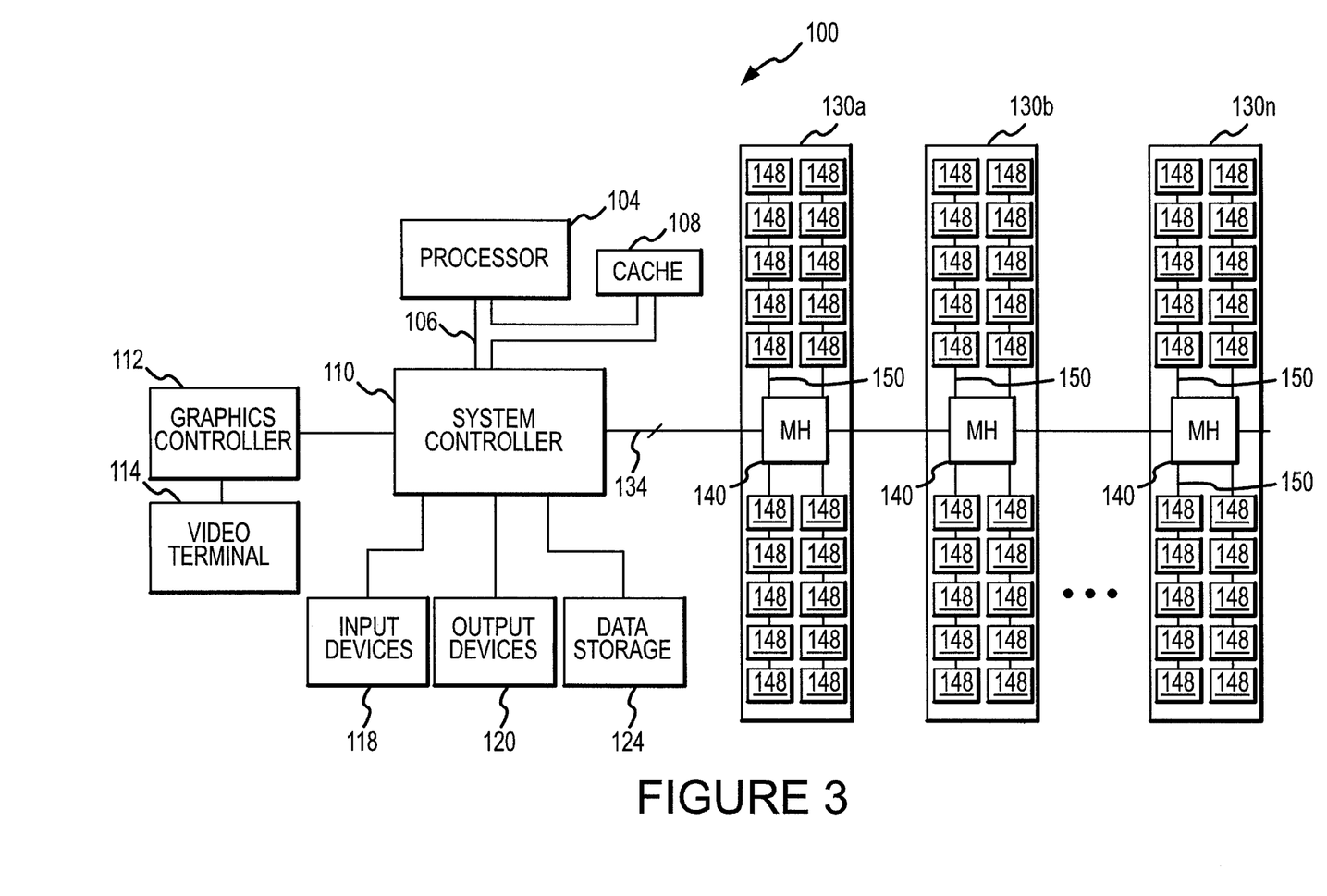
FIG. 3 is a block diagram of a computer system having a system memory that uses a plurality of memory hub memory modules, each of which use the peak detector of FIG. 2 or a peak detector according to some other example of the invention.

Peak detectors according to various examples of the invention, including the peak detector 20 shown in FIG. 2, can be used for a variety of purposes in a wide variety of electronic devices. For example, a peak detector according to one example of the invention can be used in a computer system 100 as shown in FIG. 3. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, as previously mentioned, is usually static random access memory ("SRAM"). Finally, the processor bus 106 is coupled to a system controller 110, which is also sometimes referred to as a "North Bridge" or "memory controller."

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 is coupled to several memory modules 130a,b . . . n, which serve as system memory for the computer system 100. The memory modules 130 are preferably coupled to the system controller 110 through a high-speed link 134, which is preferably a high-speed differential signal path through which at least one digital differential signal is coupled. However, other communications paths may also be used. The memory modules 130 are shown coupled to the system controller 110 in a point-to-point arrangement in which each segment of the high-speed link 134 is coupled between only two points. Therefore, all but the final memory module 130n is used as a conduit for memory requests and data coupled to and from downstream memory modules 130. However, it will be understood that other topologies may also be used. A switching topology may also be used in which the system controller 110 is selectively coupled to each of the memory modules 130 through a switch (not shown). Other topologies that may be used will be apparent to one skilled in the art.

Each of the memory modules 130 includes a memory hub 140 for controlling access to 16 memory devices 148, which, in the example illustrated in FIG. 3, are synchronous dynamic random access memory ("SDRAM") devices. The memory hub 140 in all but the final memory module 130 also acts as a conduit for coupling memory commands to downstream memory hubs 140 and data to and from downstream memory hubs 140. However, a fewer or greater number of memory devices 148 may be used, and memory devices other than SDRAM devices 148 may, of course, also be used. The memory hub 140 is coupled to each of the system memory devices 148 through a bus system 150, which normally includes a control bus, an address bus and a data bus.

As explained in greater detail below, each of the memory hubs 140 include a peak detector according to one example of the invention that detects the presence of differential digital signals coupled through the high-speed link 134. In response to detecting the presence of the digital signals, the peak detector activates the memory hub 140 containing the peak detector. The use of a peak detector that can detect when the absolute value of a differential signal of either polarity exceeds a precise threshold allows the memory hub 140 to be activated responsive to very low amplitude digital signals and still not respond to noise that may be present on the high-speed-link 134.

Figure 4:
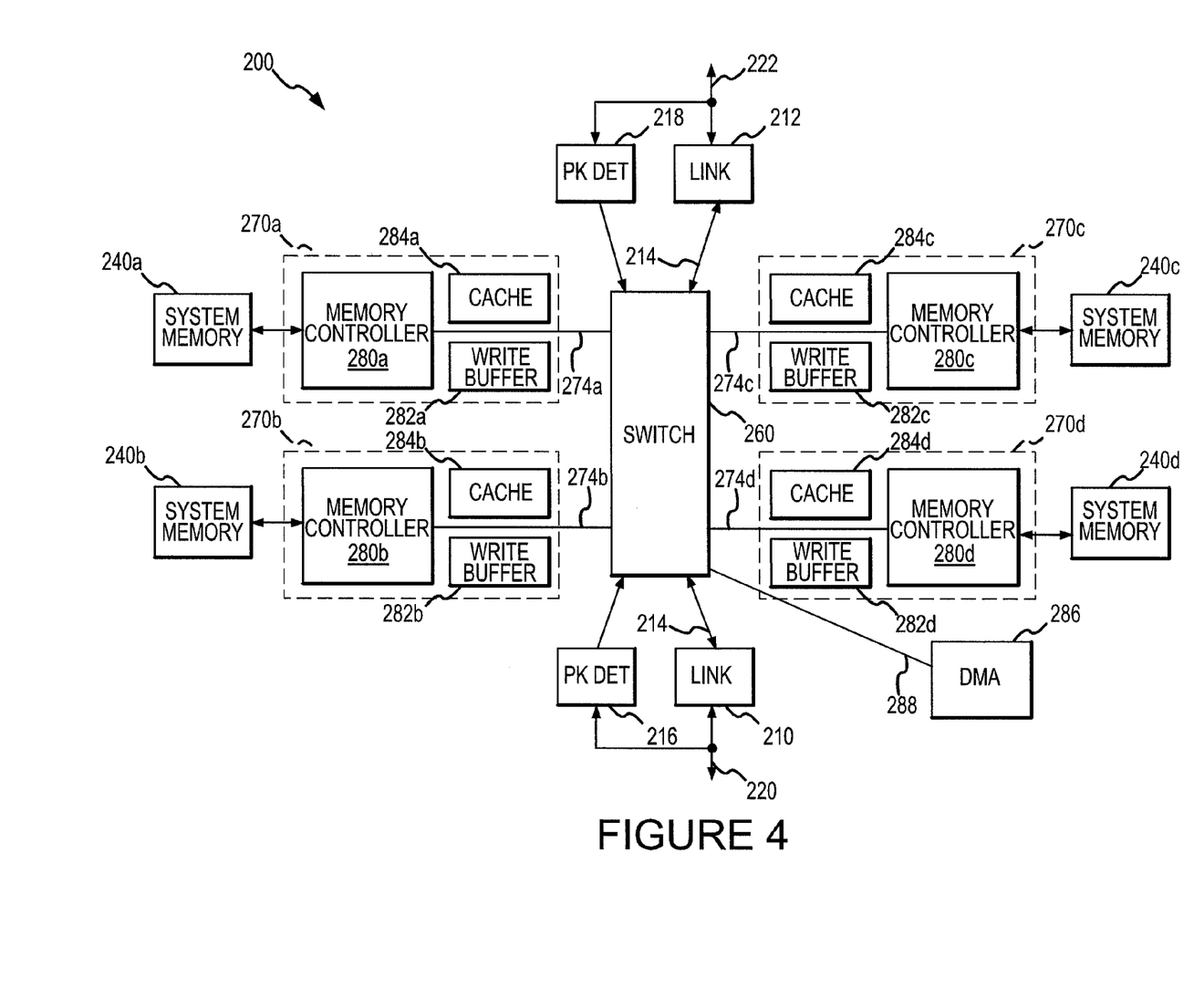
FIG. 4 is a block diagram of a memory hub used in each of the memory hub modules shown in FIG. 3 according to one example of the invention.

A memory hub 200 according to an example of the present invention is shown in FIG. 4. The memory hub 200 can be substituted for the memory hub 140 of FIG. 3. The memory hub 200 is shown in FIG. 4 as being coupled to four memory devices 240a-d, which, in the present example are conventional SDRAM devices. In an alternative embodiment, the memory hub 200 is coupled to four different banks of memory devices, rather than merely four different memory devices 240a-d, with each bank typically having a plurality of memory devices. However, for the purpose of providing an example, the present description will be with reference to the memory hub 200 coupled to the four memory devices 240a-d. It will be appreciated that the necessary modifications to the memory hub 200 to accommodate multiple banks of memory is within the knowledge of those ordinarily skilled in the art.

Further included in the memory hub 200 are link interfaces 210 and 212 for coupling the memory module on which the memory hub 200 is located to a first high speed data link 220 and a second high speed data link 222, respectively. The link interfaces 210 and 212 allow the memory hub 200 to be used as a conduit for memory requests and data to and from downstream memory modules 130. As previously discussed with respect to FIG. 3, the high speed data links 220, 222 are preferably signal lines through which digital differential signals are coupled. The link interfaces 210, 212 are conventional, and include circuitry used for transferring data, command, and address information to and from the high speed data links 220, 222. As is well known, such circuitry includes transmitter and receiver logic known in the art. It will be appreciated that those ordinarily skilled in the art have sufficient understanding to modify the link interfaces 210, 212 to be used with specific types of communication paths, and that such modifications to the link interfaces 210, 212 can easily be made.

The link interfaces 210, 212 are coupled to a switch 260 through a plurality of bus and signal lines, represented by busses 214. The busses 214 are conventional, and include a write data bus and a read data bus, although a single bi-directional data bus may alternatively be provided to couple data in both directions through the link interfaces 210, 212. It will be appreciated by those ordinarily skilled in the art that the busses 214 are provided by way of example, and that the busses 214 may include fewer or greater signal lines, such as further including a request line and a snoop line, which can be used for maintaining cache coherency.

The link interfaces 210, 212 include circuitry that allow the memory hub 200 to be connected in the system memory in a point-to-point configuration, as previously explained. This type of interconnection provides better signal coupling between the processor 104 and the memory hub 200 for several reasons, including relatively low capacitance, relatively few line discontinuities to reflect signals and relatively short signal paths. However, the link interfaces 210 and 212 could also be used to allow coupling to the memory hubs 200 in a variety of other configurations.

According to one example of the invention, the memory hub 200 includes peak detectors 216, 218 coupled to the high-speed links 220, 222, respectively, and to the switch 260. The peak detectors detect digital differential signals on the links 220, 222, respectively, and, in response thereto, apply a respective actuating signal to the switch 260. The switch 260 then enables the operation of the memory hub 200, and it may apply power to all or some of the components of the memory hub 200 from which power was removed when the memory hub 200 was inactive.

The switch 260 is further coupled to four memory interfaces 270a-d which are, in turn, coupled to the system memory devices 240a-d, respectively. The switch 260 coupling the link interfaces 210, 212 and the memory interfaces 270a-d can be any of a variety of conventional or hereinafter developed switches. By providing a separate and independent memory interface 270a-d for each system memory device 240a-d, respectively, the memory hub 200 avoids bus or memory bank conflicts that typically occur with single channel memory architectures. The switch 260 is coupled to each memory interface through a plurality of bus and signal lines, represented by busses 274. The busses 274 include a write data bus, a read data bus, and a request line. However, it will be understood that a single bi-directional data bus may alternatively be used instead of a separate write data bus and read data bus. Moreover, the busses 274 can include a greater or lesser number of signal lines than those previously described.

Each memory interface 270a-d may be specially adapted to the system memory devices 240a-d to which it is coupled. More specifically, each memory interface 270a-d may be specially adapted to provide and receive the specific signals received and generated, respectively, by the system memory device 240a-d to which it is coupled. Also, the memory interfaces 270a-d are capable of operating with system memory devices 240a-d operating at different clock frequencies. As a result, the memory interfaces 270a-d isolate the processor 104 from changes that may occur at the interface between the memory hub 230 and memory devices 240a-d coupled to the memory hub 200, and it provides a more controlled environment to which the memory devices 240a-d may interface.

With further reference to FIG. 4, each of the memory interfaces 270a-d includes a respective memory controller 280, a respective write buffer 282, and a respective cache memory unit 284. The memory controller 280 performs the same functions as a conventional memory controller by providing control, address and data signals to the system memory devices 240a-d to which it is coupled and receiving data signals from the system memory devices 240a-d to which it is coupled. The write buffer 282 and the cache memory unit 284 include the normal components of a buffer and cache memory, including a tag memory, a data memory, a comparator, and the like, as is well known in the art. The memory devices used in the write buffer 282 and the cache memory unit 284 may be either DRAM devices, static random access memory ("SRAM") devices, other types of memory devices, or a combination of all three. Furthermore, any or all of these memory devices as well as the other components used in the cache memory unit 284 may be either embedded or stand-alone devices.

The write buffer 282 in each memory interface 270a-d is used to store write requests while a read request is being serviced. In such a system, the processor 104 can issue a write request to a system memory device 240a-d even if the memory device to which the write request is directed is busy servicing a prior write or read request. Using this approach, memory requests can be serviced out of order since an earlier write request can be stored in the write buffer 282 while a subsequent read request is being serviced. The ability to buffer write requests to allow a read request to be serviced can greatly reduce memory read latency since read requests can be given first priority regardless of their chronological order. For example, a series of write requests interspersed with read requests can be stored in the write buffer 282 to allow the read requests to be serviced in a pipelined manner followed by servicing the stored write requests in a pipelined manner. As a result, lengthy settling times between coupling write request to the memory devices 270a-d and subsequently coupling read request to the memory devices 270a-d for alternating write and read requests can be avoided.

The use of the cache memory unit 284 in each memory interface 270a-d allows the processor 104 to receive data responsive to a read command directed to a respective system memory device 240a-d without waiting for the memory device 240a-d to provide such data in the event that the data was recently read from or written to that memory device 240a-d. The cache memory unit 284 thus reduces the read latency of the system memory devices 240a-d to maximize the memory bandwidth of the computer system. Similarly, the processor 104 can store write data in the cache memory unit 284 and then perform other functions while the memory controller 280 in the same memory interface 270a-d transfers the write data from the cache memory unit 284 to the system memory device 240a-d to which it is coupled.

Further included in the memory hub 200 is a DMA engine 286 coupled to the switch 260 through a bus 288. The DMA engine 286 enables the memory hub 200 to move blocks of data from one location in the system memory to another location in the system memory without intervention from the processor 104. The bus 288 includes a plurality of conventional bus lines and signal lines, such as address, control, data busses, and the like, for handling data transfers in the system memory. Conventional DMA operations well known by those ordinarily skilled in the art can be implemented by the DMA engine 286. The DMA engine 286 is able to read a link list in the system memory to execute the DMA memory operations without processor intervention, thus, freeing the processor 104 and the bandwidth limited system bus from executing the memory operations. The DMA engine 286 can also include circuitry to accommodate DMA operations on multiple channels, for example, for each of the system memory devices 240a-d. Such multiple channel DMA engines are well known in the art and can be implemented using conventional technologies.

From the foregoing it will be appreciated that, although specific embodiments of the invention have been described herein for purposes of illustration, it will be understood by one skilled in the art that various modifications may be made without deviating from the spirit and scope of the invention. Accordingly, the invention is not limited except as by the appended claims.

What is claimed is:

1. A peak voltage detector for detecting the peak amplitude of an input signal, the peak voltage detector comprising:
   a capacitor coupled to a feedback node;
   a first comparator coupled to receive the input signal and to receive a feedback signal from the feedback node, the first comparator being operable to compare the amplitude of the feedback signal to the amplitude of the input signal and to generate a first output signal when the amplitude of the input signal is greater than the amplitude of the feedback signal;
   a second comparator coupled to receive the input signal and to receive the feedback signal from the feedback node, the second comparator being operable to compare the amplitude of the feedback signal to the amplitude of the negative of the input signal and to generate a second output signal when the amplitude of the negative of the input signal is greater than the amplitude of the feedback signal; and
   a current source coupled to the first and second comparators, the current source being operable to couple current to the feedback node responsive to receiving either the first output signal from the first comparator or the second output signal from the second comparator.

2. The peak voltage detector of claim 1 wherein the current source comprises:
   a first current source device coupled to the first comparator, the first current source device being operable to apply current to the feedback node responsive to receiving the first output signal from the first comparator; and
   a second current source device coupled to the second comparator, the second current source device being operable to apply current to the feedback node responsive to receiving the second output signal from the second comparator.

3. The peak voltage detector of claim 2 wherein the first and second current source devices comprise respective first and second MOSFET transistors.

4. The peak voltage detector of claim 1 wherein the current source is operable to couple a positive current to the feedback node responsive to receiving the first or second output signal.

5. The peak voltage detector of claim 1, further comprising an output comparator having a first input coupled to receive the feedback signal from the feedback node and a second input coupled to receive a reference voltage, the output comparator being operable to generate a first logic level when the amplitude of the feedback signal is less than the amplitude of the reference voltage, and to generate a second logic level when the amplitude of the feedback signal is greater than the amplitude of the reference voltage.

6. The peak voltage detector of claim 1 wherein the input signal comprises a differential input signal, and wherein the first comparator is operable to compare the amplitude of the feedback signal to the differential amplitude of the differential input signal and to generate the first output signal when the differential amplitude of the differential input signal is greater than the amplitude of the feedback signal, and wherein the second comparator is operable to compare the amplitude of the feedback signal to the negative of the differential amplitude of the differential input signal and to generate the second output signal when the negative of the differential amplitude of the differential input signal is greater than the amplitude of the feedback signal.

7. The peak voltage detector of claim 1, further comprising a resistor connected in parallel with the capacitor.

8. A peak voltage detector for detecting the absolute value of a peak differential amplitude of a differential input signal, the peak voltage detector comprising:
    a capacitor coupled to a feedback node on which a feedback signal is generated;
    a differential amplifier having a pair of input terminals coupled to receive the differential input signal, the differential amplifier having first and second differential output terminals on which a pair of differential output signals are generated;
    a first differential comparator having positive and negative differential input terminals coupled to the first and second output terminals, respectively, of the differential amplifier, the first differential comparator further having at least one feedback terminal coupled to receive the feedback signal from the feedback node, the first differential comparator being operable to generate at an output terminal a first output signal responsive to the voltage at the positive differential input terminal less the voltage at the negative differential input terminal being greater than the voltage of the feedback signal;
    a second differential comparator having positive and negative differential input terminals coupled to the second and first output terminals, respectively, of the differential amplifier, the second differential comparator further having at least one feedback terminal coupled to receive the feedback signal from the feedback node, the second differential comparator being operable to generate a second output signal at an output terminal responsive to the voltage at the positive differential input terminal less the voltage at the negative differential input terminal being greater than the voltage of the feedback signal;
    a first transistor having a gate coupled to the output terminal of the first differential comparator, a source connected to a supply voltage, and a drain connected to the feedback node; and
    a second transistor having a gate coupled to the output terminal of the second differential comparator, a source connected to the supply voltage, and a drain connected to the feedback node.

9. The peak voltage detector of claim 8 wherein the supply voltage comprises a positive supply voltage, and wherein each of the first and second transistors comprises a respective PMOS transistor.

10. The peak voltage detector of claim 8 wherein the first differential comparator comprises:
    a first differential amplifying device having positive and negative differential input terminals coupled to the first and second output terminals, respectively, of the differential amplifier, the first differential amplifying device further having at least one feedback terminal coupled to receive the feedback signal from the feedback node, the first differential amplifying device being operable to generate a differential output signal at a pair of differential output terminals having a voltage corresponding to the voltage at the positive differential input terminal less the voltage at the negative differential input terminal and less the voltage of the feedback signal;
    a second differential amplifying device having positive and negative differential input terminals coupled to the second and first output terminals, respectively, of the differential amplifier, the second differential amplifying device further having at least one feedback terminal coupled to receive the feedback signal from the feedback node, the second differential amplifying device being operable to generate a differential output signal at a pair of differential output terminals having a voltage corresponding to the voltage at the negative differential input terminal less the voltage at the positive differential input terminal and less the voltage of the feedback signal;
    a first comparator having positive and negative comparator inputs coupled to the differential output terminals of the first differential amplifying device, the first comparator having an output terminal coupled to the gate of the first transistor; and
    a second comparator having positive and negative comparator inputs coupled to the differential output terminals of the second differential amplifying device, the second comparator having an output terminal coupled to the gate of the second transistor.

11. The peak voltage detector of claim 8, further comprising a resistor connected in parallel with the capacitor.

12. The peak voltage detector of claim 8, further comprising an output comparator having a first input coupled to receive the feedback signal from the feedback node and a second input coupled to receive a reference voltage, the output comparator being operable to generate a first logic level when the amplitude of the feedback signal is less than the amplitude of the reference voltage, and to generate a second logic level when the amplitude of the feedback signal is greater than the amplitude of the reference voltage.

13. A memory module, comprising:
    a plurality of memory devices; and
    a memory hub, comprising:
    a link interface receiving an input signal corresponding to memory requests for access to memory cells in at least one of the memory devices;
    a memory device interface coupled to the link interface and the memory devices, the memory device responsive to the memory requests received by the link interface to couple corresponding command and address signals to the memory devices for access to memory cells in at least one of the memory devices and to receive read data responsive to at least some of the command and address signals; and an activation circuit operable to generate an activation signal for activating the memory hub, the activation circuit comprising:

a capacitor coupled to a feedback node;

a first comparator coupled to receive the input signal from the link interface and to receive a feedback signal from the feedback node, the first comparator being operable to compare the amplitude of the feedback signal to the amplitude of the input signal and to generate a first output signal when the amplitude of the input signal is greater than the amplitude of the feedback signal;

a second comparator coupled to receive the input signal from the link interface and to receive the feedback signal from the feedback node, the second comparator being operable to compare the amplitude of the feedback signal to the amplitude of the negative of the input signal and to generate a second output signal when the amplitude of the negative of the input signal is greater than the amplitude of the feedback signal;

a current source coupled to the first and second comparators, the current source being operable to couple current to the feedback node responsive to receiving either the first output signal from the first comparator or the second output signal from the second comparator; and an output comparator having a first input coupled to receive the feedback signal from the feedback node and a second input coupled to receive a reference voltage, the output comparator being operable to generate the activation signal when the amplitude of the feedback signal is greater than the amplitude of the reference voltage.

14. The memory module of claim 13 wherein the current source comprises:

a first current source device coupled to the first comparator, the first current source device being operable to apply current to the feedback node responsive to receiving the first output signal from the first comparator; and a second current source device coupled to the second comparator, the second current source device being operable to apply current to the feedback node responsive to receiving the second output signal from the second comparator.

15. The memory module of claim 13 wherein the current source is operable to couple a positive current to the feedback node responsive to receiving the first or second output signal.

16. The memory module of claim 13 wherein the input signal received from the link interface comprises a differential input signal, and wherein the first comparator is operable to compare the amplitude of the feedback signal to the differential amplitude of the differential input signal and to generate the first output signal when the differential amplitude of the differential input signal is greater than the amplitude of the feedback signal, and wherein the second comparator is operable to compare the amplitude of the feedback signal to the negative of the differential amplitude of the differential input signal and to generate the second output signal when the negative of the differential amplitude of the differential input signal is greater than the amplitude of the feedback signal.

17. The memory module of claim 13, wherein the memory devices comprise dynamic random access memory devices.

18. A memory module, comprising:

a plurality of memory devices; and a memory hub, comprising:

a link interface receiving an input signal corresponding to memory requests for access to memory cells in at least one of the memory devices;

a memory device interface coupled to the link interface and the memory devices, the memory device interface being operable responsive to the memory request received by the link interface to couple corresponding command and address signals to the memory devices for access to memory cells in at least one of the memory devices and to receive read data responsive to at least some of the command and address signals; and an activation circuit operable to generate an activation signal for activating the memory hub, the activation circuit comprising:

a capacitor coupled to a feedback node;

a first comparator coupled to receive the input signal from the link interface and to receive a feedback signal from the feedback node, the first comparator being operable to compare the amplitude of the feedback signal to the amplitude of the input signal and to generate a first output signal when the amplitude of the input signal is greater than the amplitude of the feedback signal;

a second comparator coupled to receive the input signal from the link interface and to receive the feedback signal from the feedback node, the second comparator being operable to compare the amplitude of the feedback signal to the amplitude of the negative of the input signal and to generate a second output signal when the amplitude of the negative of the input signal is greater than the amplitude of the feedback signal; and a current source coupled to the first and second comparators, the current source being operable to couple current to the feedback node responsive to receiving either the first output signal from the first comparator or the second output signal from the second comparator.

19. The memory module of claim 18 wherein the current source comprises:

a first current source device coupled to the first comparator, the first current source device being operable to apply current to the feedback node responsive to receiving the first output signal from the first comparator; and a second current source device coupled to the second comparator, the second current source device being operable to apply current to the feedback node responsive to receiving the second output signal from the second comparator.

20. The memory module of claim 18 wherein the current source is operable to couple a positive current to the feedback node responsive to receiving the first or second output signal.

21. The memory module of claim 18 wherein the input signal received from the link interface comprises a differential input signal, and wherein the first comparator is operable to compare the amplitude of the feedback signal to the differential amplitude of the differential input signal and to generate the first output signal when the differential amplitude of the differential input signal is greater than the amplitude of the feedback signal, and wherein the second comparator is operable to compare the amplitude of the feedback signal to the negative of the differential amplitude of the differential input signal and to generate the second output signal when the negative of the differential amplitude of the differential input signal is greater than the amplitude of the feedback signal.

22. The memory module of claim 18 wherein the memory devices comprise dynamic random access memory devices.

23. A memory hub, comprising:

a link interface receiving an input signal corresponding to memory requests;

a memory device interface operable to output memory requests and to receive read data responsive to at least some of the memory requests; and an activation circuit operable to generate an activation signal for activating the memory hub, the activation circuit comprising:
a capacitor coupled to a feedback node;
a first comparator coupled to receive the input signal from the link interface and to receive a feedback signal from the feedback node, the first comparator being operable to compare the amplitude of the feedback signal to the amplitude of the input signal and to generate a first output signal when the amplitude of the input signal is greater than the amplitude of the feedback signal;
a second comparator coupled to receive the input signal from the link interface and to receive the feedback signal from the feedback node, the second comparator being operable to compare the amplitude of the feedback signal to the amplitude of the negative of the input signal and to generate a second output signal when the amplitude of the negative of the input signal is greater than the amplitude of the feedback signal;
a current source coupled to the first and second comparators, the current source being operable to couple current to the feedback node responsive to receiving either the first output signal from the first comparator or the second output signal from the second comparator; and
an output comparator having a first input coupled to receive the feedback signal from the feedback node and a second input coupled to receive a reference voltage, the output comparator being operable to generate the activation signal when the amplitude of the feedback signal is greater than the amplitude of the reference voltage.

24. The memory hub of claim 23 wherein the current source comprises:
a first current source device coupled to the first comparator, the first current source device being operable to apply current to the feedback node responsive to receiving the first output signal from the first comparator; and
a second current source device coupled to the second comparator, the second current source device being operable to apply current to the feedback node responsive to receiving the second output signal from the second comparator.

25. The memory hub of claim 23 wherein the current source is operable to couple a positive current to the feedback node responsive to receiving the first or second output signal.

26. The memory hub of claim 23 wherein the input signal received from the link interface comprises a differential input signal, and wherein the first comparator is operable to compare the amplitude of the feedback signal to the differential amplitude of the differential input signal and to generate the first output signal when the differential amplitude of the differential input signal is greater than the amplitude of the feedback signal, and wherein the second comparator is operable to compare the amplitude of the feedback signal to the negative of the differential amplitude of the differential input signal and to generate the second output signal when the negative of the differential amplitude of the differential input signal is greater than the amplitude of the feedback signal.

27. A memory hub, comprising:
a link interface receiving an input signal corresponding to memory requests;
a memory device interface operable to output memory requests and to receive read data responsive to at least some of the memory requests; and
an activation circuit operable to generate an activation signal for activating the memory hub, the activation circuit comprising:
a capacitor coupled to a feedback node;
a first comparator coupled to receive the input signal from the link interface and to receive a feedback signal from the feedback node, the first comparator being operable to compare the amplitude of the feedback signal to the amplitude of the input signal and to generate a first output signal when the amplitude of the input signal is greater than the amplitude of the feedback signal;
a second comparator coupled to receive the input signal from the link interface and to receive the feedback signal from the feedback node, the second comparator being operable to compare the amplitude of the feedback signal to the amplitude of the negative of the input signal and to generate a second output signal when the amplitude of the negative of the input signal is greater than the amplitude of the feedback signal;
a current source coupled to the first and second comparators, the current source being operable to couple current to the feedback node responsive to receiving either the first output signal from the first comparator or the second output signal from the second comparator.

28. The memory hub of claim 27 wherein the current source comprises:
a first current source device coupled to the first comparator, the first current source device being operable to apply current to the feedback node responsive to receiving the first output signal from the first comparator; and
a second current source device coupled to the second comparator, the second current source device being operable to apply current to the feedback node responsive to receiving the second output signal from the second comparator.

29. The memory hub of claim 27 wherein the current source is operable to couple a positive current to the feedback node responsive to receiving the first or second output signal.

30. The memory hub of claim 27 wherein the input signal received from the link interface comprises a differential input signal, and wherein the first comparator is operable to compare the amplitude of the feedback signal to the differential amplitude of the differential input signal and to generate the first output signal when the differential amplitude of the differential input signal is greater than the amplitude of the feedback signal, and wherein the second comparator is operable to compare the amplitude of the feedback signal to the negative of the differential amplitude of the differential input signal and to generate the second output signal when the negative of the differential amplitude of the differential input signal is greater than the amplitude of the feedback signal.

31. A processor-based system, comprising:
a central processing unit ("CPU");
a system controller coupled to the CPU, the system controller having an input port and an output port;
an input device coupled to the CPU through the system controller;
an output device coupled to the CPU through the system controller;
a storage device coupled to the CPU through the system controller;
a plurality of memory modules, each of the memory modules comprising:
a plurality of memory devices; and
a memory hub, comprising:
a high-speed link coupled to the CPU through the system controller;
a link interface coupled to the high-sped link, the link interface receiving an input signal corresponding to memory requests for access to memory cells in at least one of the memory devices;

a memory device interface coupled to the memory devices, the memory device interface being operable to couple memory requests to the memory devices for access to memory cells in at least one of the memory devices and to receive read data responsive to at least some of the memory requests; and an activation circuit operable to generate an activation signal for activating the memory hub, the activation circuit comprising:

a capacitor coupled to a feedback node;

a first comparator coupled to receive the input signal from the link interface and to receive a feedback signal from the feedback node, the first comparator being operable to compare the amplitude of the feedback signal to the amplitude of the input signal and to generate a first output signal when the amplitude of the input signal is greater than the amplitude of the feedback signal;

a second comparator coupled to receive the input signal from the link interface and to receive the feedback signal from the feedback node, the second comparator being operable to compare the amplitude of the feedback signal to the amplitude of the negative of the input signal and to generate a second output signal when the amplitude of the negative of the input signal is greater than the amplitude of the feedback signal; and a current source coupled to the first and second comparators, the current source being operable to couple current to the feedback node responsive to receiving either the first output signal from the first comparator or the second output signal from the second comparator; and an output comparator having a first input coupled to receive the feedback signal from the feedback node and a second input coupled to receive a reference voltage, the output comparator being operable to generate the activation signal when the amplitude of the feedback signal is greater than the amplitude of the reference voltage.

32. The processor-based system of claim 31 wherein the current source comprises:

a first current source device coupled to the first comparator, the first current source device being operable to apply current to the feedback node responsive to receiving the first output signal from the first comparator; and a second current source device coupled to the second comparator, the second current source device being operable to apply current to the feedback node responsive to receiving the second output signal from the second comparator.

33. The processor-based system of claim 31 wherein the current source is operable to couple a positive current to the feedback node responsive to receiving the first or second output signal.

34. The processor-based system of claim 31 wherein the input signal received from the link interface comprises a differential input signal, and wherein the first comparator is operable to compare the amplitude of the feedback signal to the differential amplitude of the differential input signal and to generate the first output signal when the differential amplitude of the differential input signal is greater than the amplitude of the feedback signal, and wherein the second comparator is operable to compare the amplitude of the feedback signal to the negative of the differential amplitude of the differential input signal and to generate the second output signal when the negative of the differential amplitude of the differential input signal is greater than the amplitude of the feedback signal.

35. The processor-based system of claim 31, wherein the memory devices comprise dynamic random access memory devices.

36. A method of generating an output signal having an amplitude corresponding to the peak amplitude of an input signal, the method comprising:

comparing the amplitude of the output signal to the amplitude of the input signal to detect when the amplitude of the input signal exceeds the amplitude of the output signal;

comparing the amplitude of the output signal to the negative of the amplitude of the input signal to detect when the negative of the amplitude of the input signal exceeds the amplitude of the output signal;

increasing the amplitude of the output signal responsive to the detecting that the amplitude of the input signal exceeds the amplitude of the output signal; and increasing the amplitude of the output signal responsive to the detecting that the negative of the amplitude of the input signal exceeds the amplitude of the output signal.

37. The method of claim 36 wherein the acts of increasing the amplitude of the output signal comprise increasing the amplitude of the output signal in a positive direction.

38. The method of claim 36, further comprising:

comparing the amplitude of the output signal to the amplitude of a reference voltage; and detecting when the amplitude of the output signal is greater than the amplitude of the reference voltage.

39. The method of claim 36 wherein the input signal comprises a differential input signal, wherein the act of comparing the amplitude of the output signal to the amplitude of the input signal comprises comparing the amplitude of the output signal to the differential amplitude of the input signal, and wherein the act of comparing the amplitude of the output signal to the negative of the amplitude of the input signal comprises comparing the amplitude of the output signal to the negative of the differential amplitude of the input signal.

40. The method of claim 36 wherein the act of increasing the amplitude of the output signal responsive to the detecting that the amplitude of the input signal exceeds the amplitude of the output signal comprises applying current to a capacitor whenever the amplitude of the input signal exceeds the amplitude of the output signal, and wherein the act of increasing the amplitude of the output signal responsive to the detecting that the negative of the amplitude of the input signal exceeds the amplitude of the output signal comprises applying current to a capacitor whenever the negative of the amplitude of the input signal exceeds the amplitude of the output signal.

41. The method of claim 40, further comprising gradually and continuously removing current from the capacitor.

* * * * *

UNITED STATES PATENT AND TRADEMARK OFFICE
CERTIFICATE OF CORRECTION

PATENT NO. : 7,560,959 B2  Page 1 of 1
APPLICATION NO. : 11/523795
DATED : July 14, 2009
INVENTOR(S) : Milam Paraschou et al.

It is certified that error appears in the above-identified patent and that said Letters Patent is hereby corrected as shown below:

In column 10, line 61, in Claim 13, after "device" insert -- interface being operable --.

In column 12, line 1, in Claim 18, delete "request" and insert -- requests --, therefor.

In column 14, line 64, in Claim 31, delete "high-sped" and insert -- high-speed --, therefor.

Signed and Sealed this

Sixteenth Day of March, 2010

David J. Kappos
*Director of the United States Patent and Trademark Office*